(12) United States Patent
Wang et al.

(10) Patent No.: US 7,940,876 B2
(45) Date of Patent: May 10, 2011

(54) USB FREQUENCY SYNCHRONIZING APPARATUS AND METHOD OF SYNCHRONIZING FREQUENCIES

(75) Inventors: Min-Kun Wang, Hukou Township, Hsinchu County (TW); Min-Hsiung Hu, Kaohsiung (TW); Chuen-An Lin, Jhubei (TW)

(73) Assignee: Holtek Semiconductor Inc., Hsinchu (TW)

( * ) Notice: Subject to any disclaimer, the term of this patent is extended or adjusted under 35 U.S.C. 154(b) by 678 days.

(21) Appl. No.: 12/010,234

(22) Filed: Jan. 23, 2008

(65) Prior Publication Data

US 2009/0116603 A1   May 7, 2009

(30) Foreign Application Priority Data

Nov. 5, 2007   (TW) .............................. 96141684 A

(51) Int. Cl.
*H04L 7/04* (2006.01)
*H04L 7/00* (2006.01)
(52) U.S. Cl. ......... 375/362; 375/354; 370/491; 370/500
(58) Field of Classification Search ............... 375/362
See application file for complete search history.

(56) References Cited

U.S. PATENT DOCUMENTS

| | | | | |
|---|---|---|---|---|
| 3,401,353 A | * | 9/1968 | Hughes | 331/11 |
| 6,118,344 A | * | 9/2000 | Toshitani et al. | 331/1 R |
| 6,396,891 B1 | * | 5/2002 | Masafumi et al. | 375/376 |
| 6,643,345 B1 | * | 11/2003 | Inoue et al. | 375/372 |
| 7,539,793 B2 | * | 5/2009 | Foster et al. | 710/61 |
| 7,602,818 B2 | * | 10/2009 | Dao et al. | 370/535 |
| 2001/0018730 A1 | * | 8/2001 | Toshitani et al. | 711/167 |
| 2003/0063627 A1 | * | 4/2003 | Toshitani | 370/503 |
| 2004/0088445 A1 | * | 5/2004 | Weigold et al. | 710/8 |
| 2006/0123176 A1 | * | 6/2006 | Fredriksson et al. | 710/305 |
| 2006/0274112 A1 | * | 12/2006 | Jackson Pulver et al. | 347/42 |
| 2007/0063776 A1 | * | 3/2007 | Okuda | 331/16 |
| 2007/0079166 A1 | * | 4/2007 | Okada et al. | 713/500 |
| 2007/0090883 A1 | * | 4/2007 | Yang et al. | 331/16 |
| 2007/0174727 A1 | * | 7/2007 | Liao et al. | 714/43 |
| 2008/0079465 A1 | * | 4/2008 | Sung et al. | 327/101 |
| 2008/0231328 A1 | * | 9/2008 | Leydier et al. | 327/105 |
| 2009/0063909 A1 | * | 3/2009 | Fredriksson et al. | 714/49 |
| 2009/0222685 A1 | * | 9/2009 | Foster et al. | 713/500 |

\* cited by examiner

*Primary Examiner* — David C Payne
*Assistant Examiner* — Erin M File
(74) *Attorney, Agent, or Firm* — Rosenberg, Klein & Lee

(57) ABSTRACT

A universal series bus (USB) frequency synchronous apparatus using a start of frame (SOF) signal generated by a master device to mark a reference interval is disclosed. The frequency synchronizing apparatus includes a frequency divider, a counter unit with a default pulse number, an arithmetic unit, and an adjusting unit. The frequency divider divides a high frequency signal by a variable frequency factor to generate a lock frequency signal. The counter is used to detect a pulse number of the lock frequency signal at a reference interval and obtain a pulse difference between the default pulse number and the detected pulse number of the lock frequency signal.

13 Claims, 4 Drawing Sheets

USB FREQUENCY SYNCHRONIZING APPARATUS AND METHOD OF SYNCHRONIZING FREQUENCIES

BACKGROUND OF THE INVENTION

1. Field of the Invention

The invention generally relates to a frequency synchronizing apparatus, and particularly to a frequency synchronizing apparatus and a method of synchronizing real-time data transmission via USB.

2. Description of the Related Art

In recent years interfaces for data transmission between various electronic devices have been abundantly designed as the electronic industry is growing fast. USB has been widely used as the transmission interface for computer platforms due to its mature specification.

The USB specification includes four types of data transmission: control type, interrupt type, bulk type and isochronous type. Each transfer type suits its corresponding application. For example, isochronous data transmission, or interrupt data transmission is needed for those products that need continuous and real-time data transmission such as USB voice communication appliances or USB loud speakers.

For the USB with isochronous data transmission, a predetermined amount of data is transmitted with a constant cycle time each time. For example, the internet voice telephone uses a microphone to receive sound and converts the sound via an analog/digital converter (ADC). The sound samples are digitized and sampled at sampling rate of 16K/sec. The sampled data is transmitted with the isochronous transfer type of data transmission at 16 sound samples per 1 ms to a master device. For the master device, it receives sampled voice data at the rate of 16 sound samples per 1 ms with the isochronous transfer type of data transmission.

However, when the sampled data is transmitted with the isochronous transfer type of data transmission, there is always a non-synchronous transmission between the master device and the slave device. Besides, the master device and the slave device each have a system frequency oscillator which operate at slightly different frequencies. The frequency difference accumulates continuously as time elapses. When the accumulated sum of frequency differences is large, the data transmitted from the master device will be more than the data received by the slave device if the master device operates at higher frequency than the slave device, and therefore the slave device will dump some data transmitted from the master device. On the other hand, if the master operates at lower frequency than the slave device, the data transmitted from the master device will be less than the data received by the slave device, and therefore the slave device will create itself some sound data to compensate for the missing data. In both cases, i.e. if the master device operates at higher frequency or at lower frequency than the slave device, the frequency difference between them will generate noises which deteriorate the data transmission quality.

One approach has been proposed to use an analog phase lock loop to obtain a UBS bus clock so as to synchronize the frequencies of the master device and the slave device. In this approach, if the analog phase lock loop cannot work quite well, the frequency difference between the master device and the slave device inevitably generates. Another approach which uses a controller firmware for the slave device has also been proposed. However, the improvement made by using the firmware for the devices is not as good as made by modifying the hardware of the devices. In addition, different controller manufacturers have their own specifications for the controllers, making the improvement of the devices complicate.

Furthermore, if the master device uses an over-sampling analog/digital converter or digital/analog converter, in addition to the sampling clock, the relationship between the sampling speed and the over-sampling clock should be also well controlled. Even if the above analog phase lock loop is used, there is an additional need of relevant circuit matching the analog phase lock loop, increasing the difficulty of chip design and the cost of manufacture and test. No other currently available approaches can completely solve the problem of frequency differences between the master device and the slave device.

SUMMARY OF THE INVENTION

It is an object of the invention to provide a frequency synchronizing apparatus which adjusts the frequency speed of a slave device according to the data transmitted from a master device. One start of frame (SOF) signal is transmitted every 1 ms and is used to mark a reference interval (error=±500 ns) to generate a lock frequency signal, so that the cycle time of the lock frequency signal is tuned up based on the cycle time of a previous reference interval. Thereby, the synchronous frequency can be locked in short time, and long-term accumulation of frequency difference between the master device and the slave device which are connected to each other can be controlled under a predetermined limit. Therefore, the data instability due to frequency difference between the slave device and the master device for real-time data transmission via USB can be solved.

In order to achieve the above and other objectives, the USB frequency synchronizing apparatus of the invention, which is applied to a slave device and uses a SOF signal generated by a master device to mark a reference interval, includes a frequency divider, a counter unit, an operating unit and an adjusting unit. The frequency divider receives a high-frequency signal and divides the high-frequency signal by a variable frequency factor to obtain a lock frequency signal. The counter has a default pulse number and obtains a currently detected deviation by calculating the difference between the default pulse number and the pulse number of the lock frequency signal at a current reference interval. The operating unit operates an error adjusting value based on the detected deviation. The adjusting unit receives the error adjusting value and generates a proportional adjusting value, so that the frequency divider adjusts the variable frequency factor based on the error adjusting value at every proportional adjusting value during the next reference interval.

The invention further provides a method of synchronizing frequencies via USB, which is applied to a slave device and uses a start of frame (SOF) signal to mark a reference interval. The method includes dividing a high frequency signal by a variable frequency factor to obtain a lock frequency signal; detecting a pulse number of the lock frequency signal at a current reference interval, calculating a pulse difference between the default pulse number and the currently detected pulse number of the lock frequency signal to obtain a currently detected deviation; recording the currently detected deviation and performing an addition based on the currently detected deviation to obtain an error adjusting value; and generating a proportional adjusting value based on the error adjusting value, so that the frequency divider adjusts the variable frequency factor based on the error adjusting value at every proportional adjusting value during the next reference interval. Thereby through the above feed-back control, the slave device receives the lock frequency signal and synchronizes the frequency with a master device it connects to.

To provide a further understanding of the invention, the following detailed description illustrates embodiments and examples of the invention, this detailed description being provided only for illustration of the invention.

DETAILED DESCRIPTION OF THE EMBODIMENTS

Figure 1:
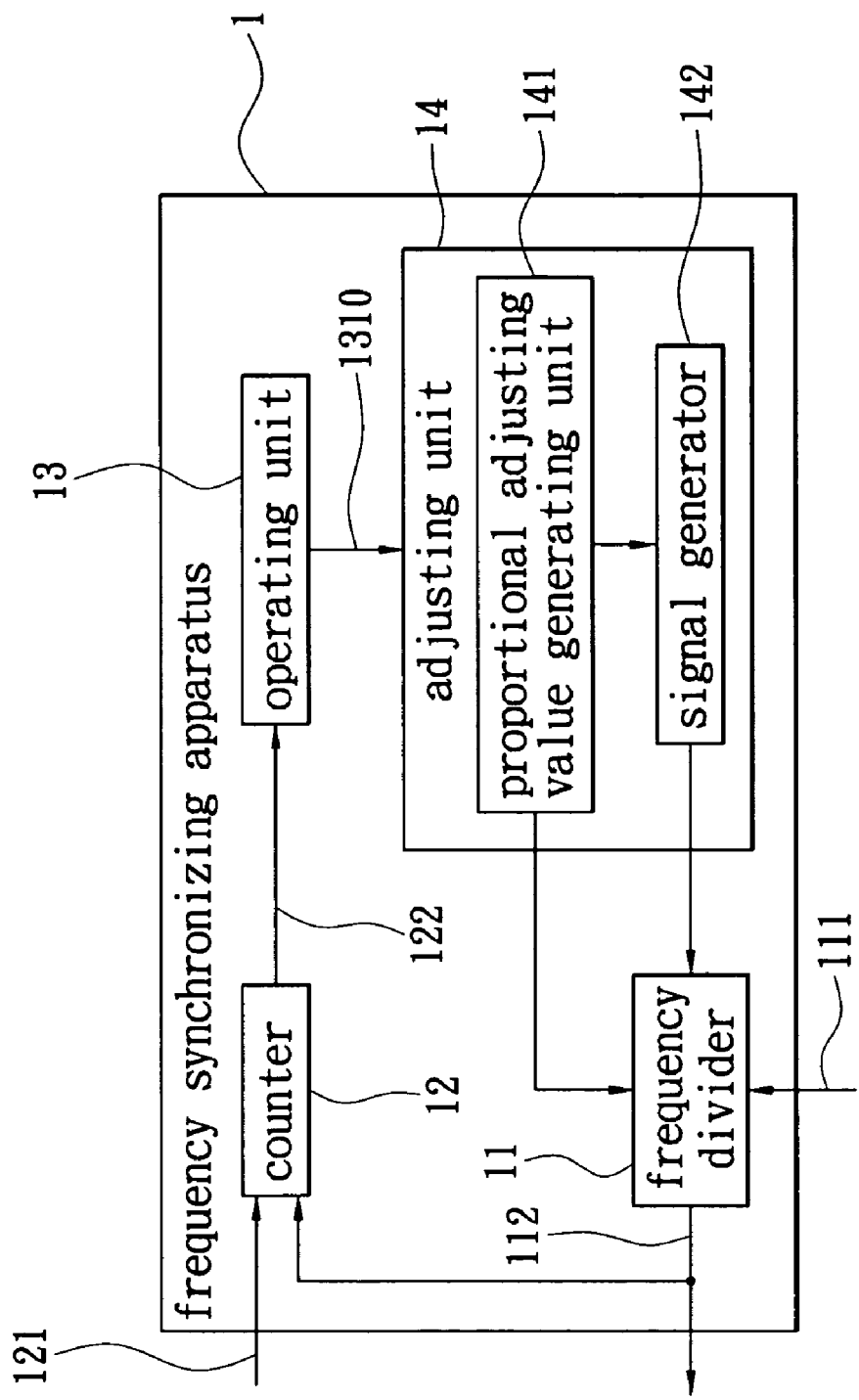
FIG. 1 is a block diagram of a USB frequency synchronizing apparatus according to one embodiment of the invention.

Wherever possible in the following description, like reference numerals will refer to like elements and parts unless otherwise illustrated.

FIG. 1 is a block diagram of a USB frequency synchronizing apparatus according to one embodiment of the invention. The frequency synchronizing apparatus 1 of the invention is used to apply to a slave device (not shown)) and response for real-time data transmission between the slave device and a master device (not shown) via a universal serial bus (USB) to achieve the frequency synchronization between the slave and master devices, preventing any data instability such as noises from generating.

When the USB is used in the frequency synchronizing apparatus 1 of the intention, the master device generates a start of frame (SOF) signal to mark a reference interval 121. A rising edge, which is formed when a USB decoding circuit detects one SOF signal, is used as a starting point of operational time unit. The result obtained in the previous operational time unit can be used for error adjustment in the next cycle time unit. According to USB specification, the SOF signal is generated every 1 ms, and therefore the reference pulse 121 is 1 ms (±500 ns).

As shown, the frequency synchronizing apparatus 1 of the invention includes a frequency divider 11, a counter 12, an operating unit 13 and an adjusting unit 14. The frequency divider 11 is used to receive high-frequency signal 111 and divide the high-frequency signal 111 by a variable frequency factor to obtain a lock frequency signal 112. The lock frequency signal 112 is a frequency signal to be locked in the invention for the slave device to operate synchronously with the master device.

The counter unit 12 can be, for example, a Down Counter, which has a default pulse number. The counter unit 12 receives the reference interval 121, and obtains a detected deviation by calculating the difference between the default pulse number and the pulse number of the lock frequency signal 112 at the reference interval 121. The counter unit 12 can be a hardware circuit or a single chip, as long as the detected deviation 122 can be obtained by calculating the difference between the default pulse number and the pulse number of the lock frequency signal 112 at the reference interval 121.

The operating unit 13 is used to record the detected deviation 122, and operate to obtain an error adjusting value 1310 based on the detected deviation 122. The detected deviation 122 and the error adjusting value 1310 can be respectively positive, negative or zero, which are put in the operation of addition.

The adjusting unit 14 is used to receive the error adjusting value 1310 and generate a proportional adjusting value to control the frequency divider 11 to adjust the variable frequency factor based on the error adjusting value 1310 at every proportional adjusting value during the next reference interval 121.

Furthermore, the adjusting unit 14 includes a proportional adjusting value generating unit 141 and a signal generator 142. The proportional adjusting value generating unit 141 receives the error adjusting value 1310 and generates the proportional adjusting value accordingly. The details about how to generate the proportional adjusting value will be illustrated via data later. The signal generator 142 can be, for example, a Down Counter, and connected to the proportional adjusting value generating unit 141. The signal generator 142 generates a control signal every time when the pulse number is counted at each proportional adjusting value for the next reference interval 121. Then the frequency divider 11 adjusts the variable frequency factor based on the error adjusting value 1310 by the obtained control signal so that the lock frequency signal 112 has an average cycle time matching the reference frequency for next reference interval.

Figure 2:
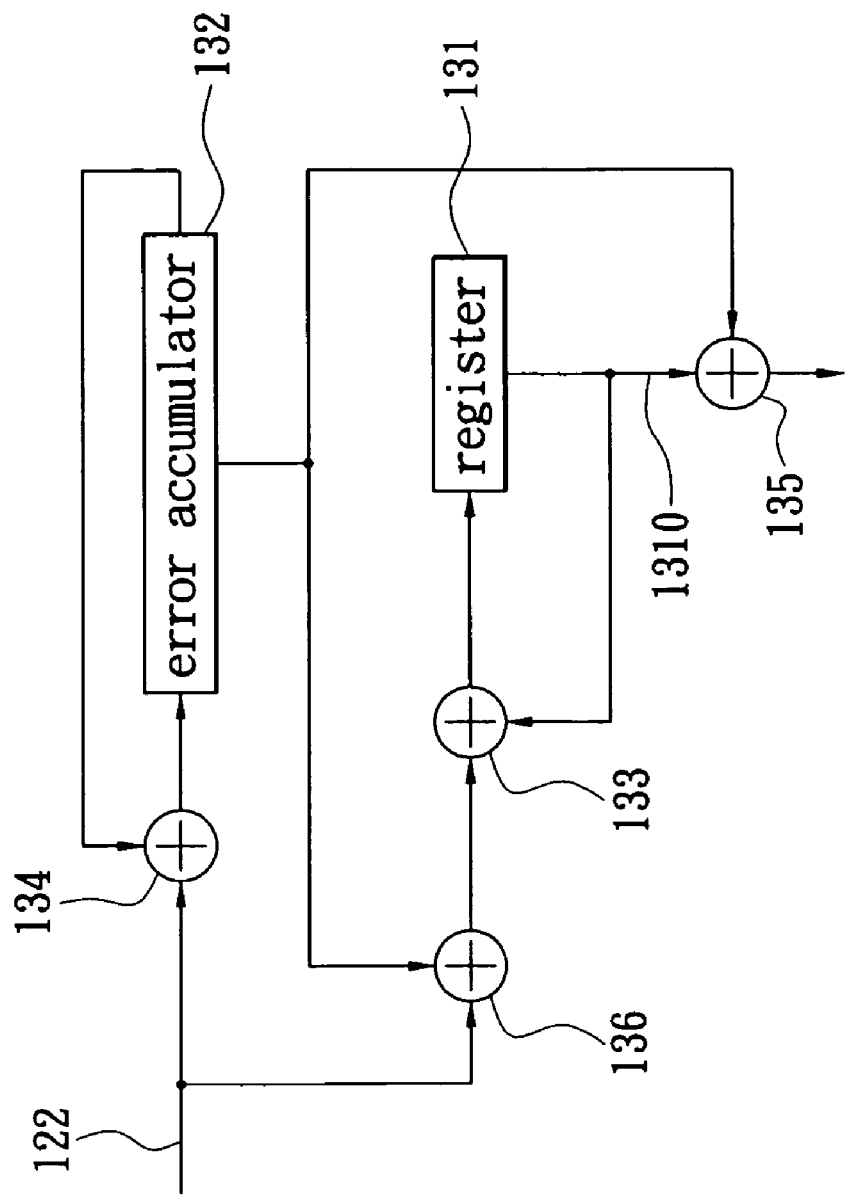
FIG. 2 is a block diagram of a circuitry of an operating unit according to one embodiment of the invention.

FIG. 2 is a block diagram of a circuitry of an operating unit according to one embodiment of the invention. As shown, the operating unit 13 further includes a register 131, an error accumulator 132 and a plurality of adders 133-136. The register 131 records short-term errors which are generated in a short term. The error accumulator 132 records long-term errors which are accumulated in long term. The adders are operated in sequence along with the register 131 and the error accumulator 132 to calculate the error adjusting value 1310.

It is noted that the frequency synchronizing apparatus is operated continuously using each reference interval 121 as its corresponding cycle time. The register 131 keeps a previously detected deviation 122 obtained at a previous reference interval 121. When the register 131 receives a currently detected deviation at a current reference interval 121, a first adder 133 adds the previously detected deviation to the currently detected deviation and stores the result back to the register 131 for calculating a current error adjusting value 1310. Similarly, the currently detected deviation 122 currently stored in the register 131 will be the value which is put into the addition at the next reference interval 121.

The error accumulator 132 accumulates the detected deviations obtained at every reference interval 121 by means of an addition operation in a second adder 134. When the sum of all the detected deviations exceeds a threshold value, a value tuning step is exerted to control the sum of all the detected deviations under a predetermined limit. The threshold value can be changed according to requirements of system, performance and real-time data quality.

The value tuning of sum of all the detected deviations is performed. Dividing the sum of all the detected deviations by the threshold value to obtain a proportional pulse value; adjusting the sum of all the detected deviations with the proportional pulse value at subsequent reference intervals until the sum is smaller than the threshold value. That means the sum of all the detected deviations is adjusted in proportion. The current error adjusting value 1310 in the register at the current reference interval 121 is added to a proportional pulse value via a third adder 135. The adjusting unit 14 accordingly generates a current proportional adjusting value after the current error adjusting value 1310 is added to proportional pulse value. The error adjusting value 1310 is originally generated by the register 131, and then renewed after the addition operation by the third adder 135, as shown in FIG. 2.

While the error accumulator 132 runs for long-term error adjustment, the error adjusting value 1310 stored in the register 131 is changed via the third adder 135. Therefore, the value tuning of sum of all the detected deviations must include a compensation process. A proportional pulse value is temporarily restored. A subsequently detected deviation 122 obtained at the next reference interval is added to a proportional pulse value via a forth adder 136. The register 131 receives an updated detected deviation and restores the result of the addition operation based on the updated detected deviation and the non-updated one for the subsequent reference interval. Thereby, compensation to the long-term error adjustment at the current reference interval 121 has been made.

Through the above feed-back control, the frequency synchronizing apparatus 1 can lock up the lock signal in short term for frequency synchronization, and further offer the slave device a stable lock signal by exerting the value tuning of sum of all the detected deviations. As such, the synchronous frequency and data transmission between the master device and the slave device can be achieved. Therefore, the unstable real-time data transmission between the master device and the slave device due to non-synchronization of frequencies can be prevented.

Figure 3:
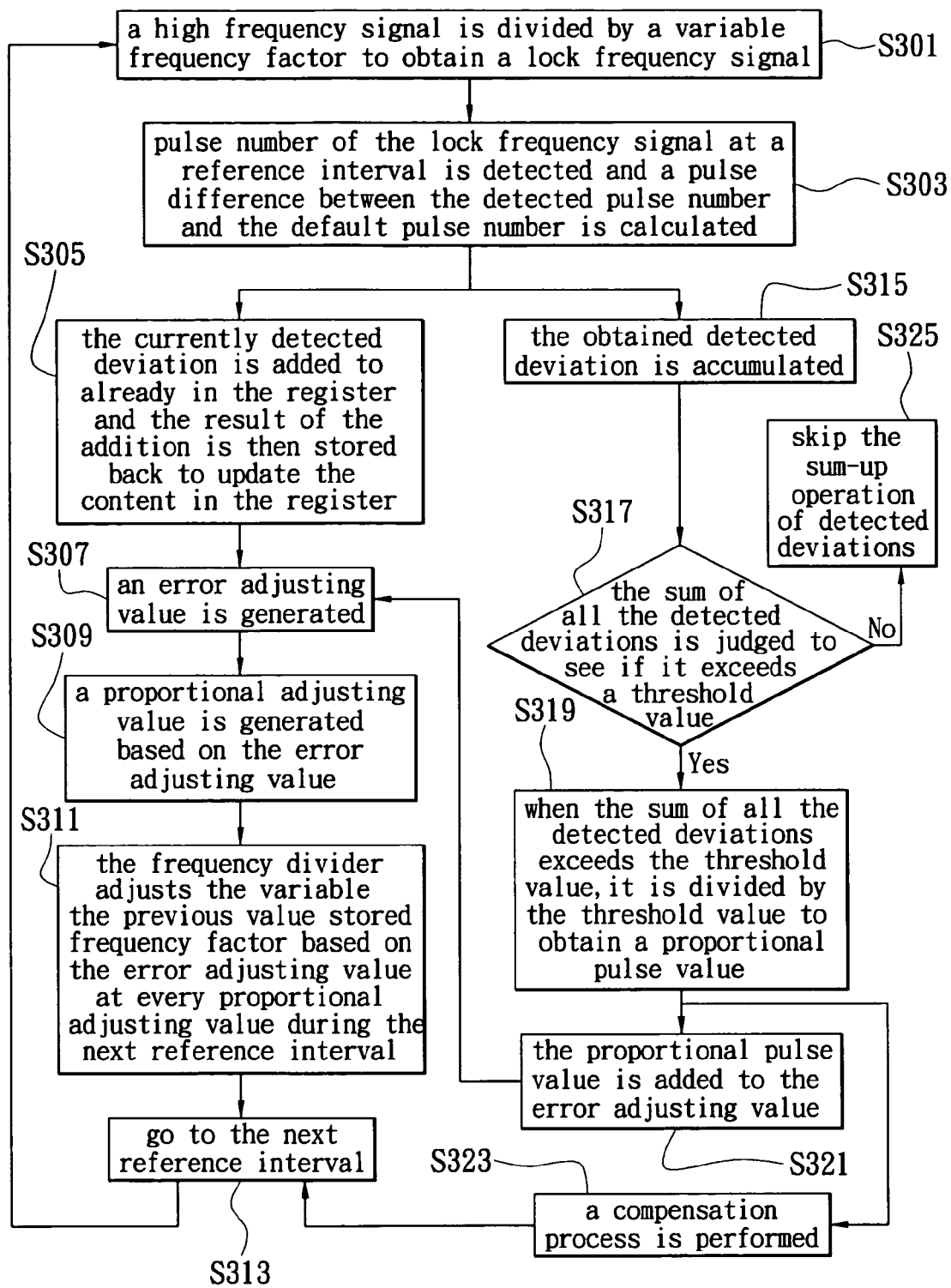
FIG. 3 is a flow chart of a method of synchronizing USB frequency according to one embodiment of the invention.

FIG. 3 is a flow chart of a method of synchronizing USB frequency according to one embodiment of the invention. As shown, the method of synchronizing USB frequency of the invention is applied to the slave device. The SOF signal generated by the master device is used as a starting point of reference interval. A high frequency signal is divided by a variable frequency factor to obtain a lock frequency signal (S301). A pulse number of the lock frequency signal at a reference interval is detected and a pulse difference between the detected pulse number and the default pulse number is calculated (S303).

The currently detected deviation is added to the previous value stored already in the register and the result of the addition is then stored back to update the content in the register (S305). The previously value stored in the register is the one which has been obtained at the previous reference interval and then undergone the addition operation. Then, an error adjusting value is generated (S307). A proportional adjusting value is generated based on the error adjusting value (S309). The frequency divider adjusts the variable frequency factor based on the error adjusting value at every proportional adjusting value during the next reference interval (S311). Thereby, the lock frequency signal 112 has an average cycle period matching the reference frequency for next reference interval. After the above steps have been done, a new cycle to repeat those steps in turns is performed for the next reference interval (S313). By this way, the required lock frequency signal can be obtained in short term by repeating the error detection and adjustment.

Every time when the step S303 has finished, the obtained detected deviation is to be accumulated (S315). The sum of all the detected deviations is judged to see if it exceeds a threshold value (S317). When the sum of all the detected deviations exceeds the threshold value, it is divided by the threshold value to obtain a proportional pulse value (S319). In order to prevent the sum of all the detected deviations from keeping unduly high, the proportional pulse value is added to the error adjusting value generated at step S307 (S321) before the steps following the step S307 are performed so as to tune up the long-term accumulated deviations by altering the error adjusting value. On the other hand, when the result of step 317 is NO, which means the sum of all detected deviations at the current reference interval does not exceed the threshold value, it goes to skip the sum-up operation of detected deviations (S325).

Furthermore, while performing the step S321 is performed, a compensation process (S323) is running as well. A subsequently detected deviation obtained at the next reference interval is added to a proportional pulse value which has been stored already. It is necessary to perform steps S315-S323 when at the current reference interval long-term accumulated deviations need to be tuned up. Therefore, the step S311 is done as the step S 323 is finished, so as to go on the step S313 for the next reference interval. By this way, the required lock frequency signal can be obtained in short term by repeating the error detection and adjustment.

The invention will be illustrated by exemplifying experimental data below. The SOF signal marking a reference interval is transmitted via USB every 1 ms. For example, a high frequency signal 49.2 MHz is divided by a variable frequency factor such as 1/3.5, 1/4 or 1/4.5 by a frequency divider to generate a synchronous lock frequency signal 12.288 MHz. The lock frequency signal has 12288 pulses at 1 ms of the reference interval. With the use of the inventive design, the sum of cycles of the pulses will vary as the time period of the previous reference interval, so that the long-term accumulated deviations due to the frequency difference between the master device and the slave device can be tuned up.

In this embodiment, the default pulse number in the counter unit is 12288, for example. The counter unit detects the difference between the default pulse number and the pulse number of the lock frequency signal at the current reference interval by using down-counter function or the similar methods. It is assumed that the default frequency factor of the frequency divider is 4, and the lock frequency signal generated by the current high-frequency signal 49.2 MHz is obtained by 49.2 MHz/4=12.3 MHz. That means 12300 pulses are currently detected for the signal 12.3 MHz at 1 ms of the current reference interval, and the currently detected deviation is obtaining by deducting the default pulse number from the currently detected pulse number: 12288−12300=−12.

The currently detected deviation (−12) represents the average cycle time of the lock frequency signal is shorter than the cycle time of the reference interval. Therefore, the 12 pulses must be dispatched over the 12288 pulses so as to elongate the average cycle time of the lock frequency signal. By this way, the subsequently detected deviation generated by the counter unit at next reference interval is close to zero.

The register is used to record any deviations generated in short term. Each detected deviation generated by the counter unit is added to the value which has been stored already in the register and then the result of the addition operation is to update the content of the register as an error adjusting value which could be positive, negative or zero. In this embodiment, the starting error adjusting value is −12.

Furthermore, the lock frequency signal 12.288 MHz in the embodiment of the invention is obtained from the high-frequency signal 49.2 MHz by the frequency divider. The factor can be 3.5, 4 or 4.5. If the error adjusting value is zero, then the frequency divider remains the factor as 4. If the error adjusting value is negative, then the lock frequency signal goes faster than the default value and needs to elongate its average cycle time. In this case, the factor should be changed to be 4.5 for part of pulses of the lock frequency signal. The more the value below zero, the more the pulses of the lock frequency signal need to be divided by 4.5. On the other hand, when the error adjusting value is positive, it means the lock frequency signal goes slower than the default value. In this case, the average cycle time of the lock frequency signal needs to be reduced, and the factor is changed to be 3.5. The more the error adjusting value above zero, the more pulses need to be divided by 3.5

Regarding to the adjusting unit, no matter the factor is 4.5 or 3.5, the lock frequency signal is adjusted ⅛ cycle of one pulse each time, and therefore total 8 times of adjustment need for a complete pulse. For the error adjusting value of −12 as example, 96 times (12*8=96) of adjustment need to be done with the result of frequency division by factor of 4.5. Therefore, the 96 times of adjustment are dispatched over the 12288 pulses. That means one adjustment is done per 128 pulses, and 128 is referred to as the proportional adjusting value. By this way, the subsequently detected deviation generated by the counter unit is closer to zero.

Furthermore, the each detected deviation generated by the counter unit is accumulated to the error accumulator which runs this error accumulation for long term. The detected deviations could be positive, negative or zero, which will balance with each other in the addition operation. When the sum of all the detected deviations exceeds a threshold vale, it will be tuned up in proportion within a certain period of time. The value tuning will be done over more reference intervals, rather than at a certain reference interval. This prevents the average cycle time of the clock signal vibrates violently in short time. In this embodiment, the threshold value is set to 16, ¹⁄₁₆ of the sum of all the detected deviations is used to balance the sum at each following reference interval until the sum becomes smaller than the threshold value 16.

Figure 4:
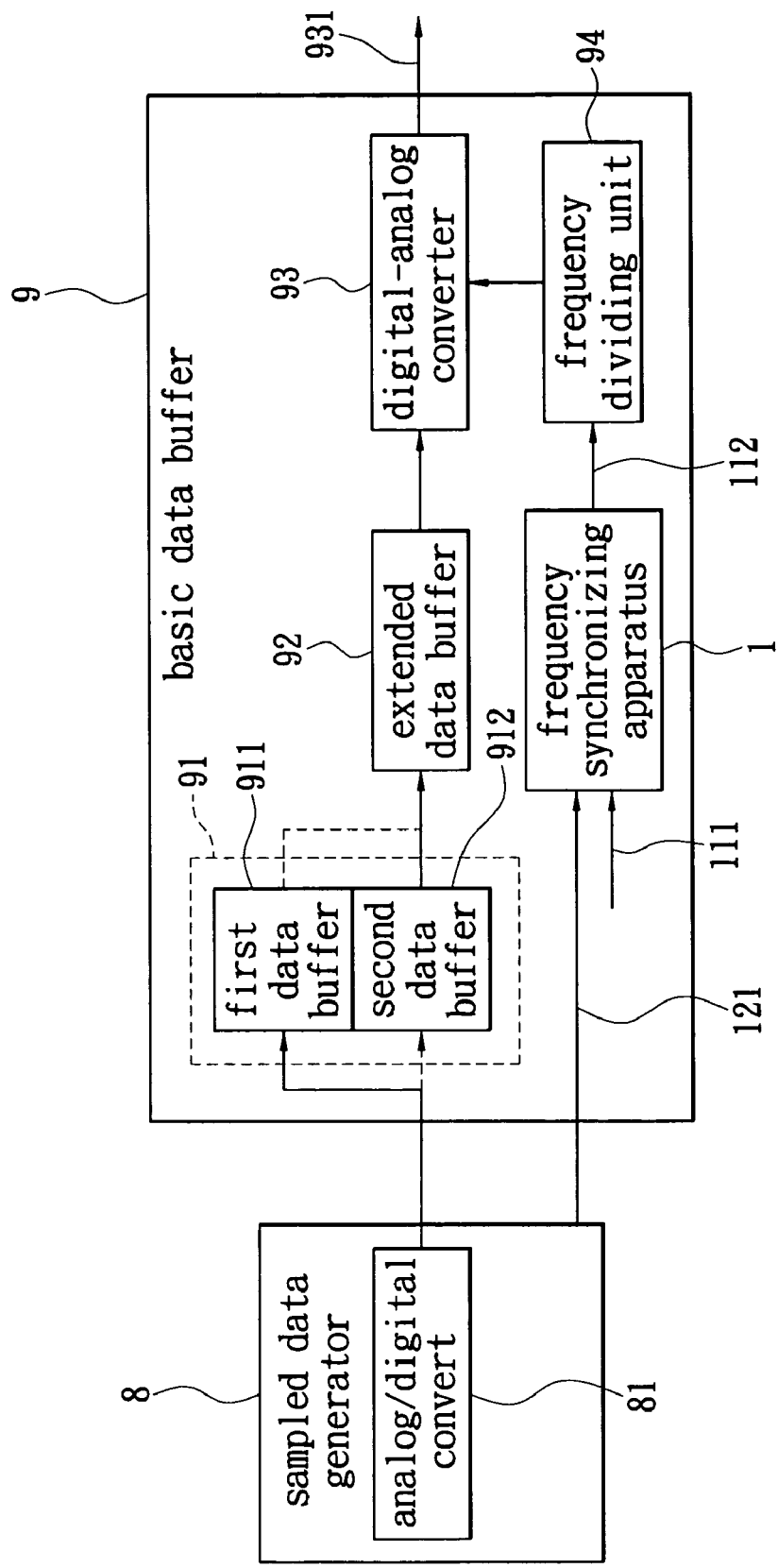
FIG. 4 is a schematic view of a configuration of a frequency synchronizing apparatus according to one embodiment of the invention.

FIG. 4 is a schematic view of a configuration of a frequency synchronizing apparatus according to one embodiment of the invention. As shown, data transmission between a sampled data generator 8 which is also called as a master device and a sampled data consumer 9 which is also called as a slave device is achieved via a USB. The sampled data generator 8 includes an analog/digital convert 81. The sampled data consumer 9 includes at least the frequency synchronizing apparatus 1, a basic data buffer 91, an extended data buffer 92, a digital-analog converter 93 and a frequency dividing unit 94. The frequency synchronizing apparatus 1 receives as a reference interval 121 the SOF signal output every 1 ms from the sampled data generator 8, and then outputs the lock frequency signal 112 by using the high-frequency signal 111. The output lock frequency signal 112 is still a high-frequency signal and then is divided by the frequency dividing unit 94 to obtain a sampling frequency for the digital-analog converter 93.

The sampled data generator 8 outputs the sampled data via the analog/digital converter 81. For the transmission specification of USB, after the sampled data consumer 9 receives the sampled data, the sampled data is temporarily stored in the basic data buffer 91, and then transmitted to the digital/analog converter 93 for conversion. After the data conversion, an output data 931 is obtained. The basic data buffer 91 includes a first data buffer and a second data buffer 912, both of which can be used respectively as an input buffer and an output buffer to increase the operational performance.

However, to prevent any data non-synchronization between the sampled data generator 8 and the sampled data consumer 9, the frequency synchronizing apparatus 1 undergoes the sampling frequency of the digital/analog converter 93 in the sampled data consumer 9 for the purpose of frequency synchronization. Furthermore, the extended data buffer 92 is used as a buffer to connect the basic data buffer 91 to the digital-analog converter 93 for the basic data buffer 91 to access data. The digital/analog converter 93 clears up before sampling frequency so that enough buffering space can be sure.

In the light of the foregoing, the frequency synchronizing apparatus of the invention uses the SOF signal transmitted every 1 ms via USB to mark a reference interval to generate a lock frequency signal. The cycle time of the lock frequency signal can be tuned up based on the previous reference interval. Therefore, the lock frequency signal can be locked synchronously in short time, while long-term accumulated deviations due to frequency difference between master device and the slave device is well controlled not to exceed the threshold value. Thereby, the problem of unstable data transmission, caused by non-synchronous frequencies between the master device and the slave device when the data is transmitted via USB, can be solved.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A frequency synchronizing apparatus for synchronizing a slave device with a start of frame (SOF) signal to mark a reference interval, comprising:
    a frequency divider, used to receive a high-frequency signal and divide the high-frequency signal by a variable frequency factor to obtain a lock frequency signal;
    a counter unit, having a default pulse number, for obtaining a currently detected deviation by calculating a difference between the default pulse number and a pulse number of the lock frequency signal during a current reference interval;
    an operating unit, used to generate an error adjusting value based on the currently detected deviation, wherein the operating unit includes:
        a register, used to receive the currently detected deviation, and generate the error adjusting value after a content of the resister is updated by adding up the currently detected deviation and a previously detected deviation which has been already stored in the resister; and
        an error accumulator, used to accumulate all the detected deviations, and perform a value tuning process when a sum of all the detected deviations exceeds a threshold value; and
    an adjusting unit, used to receive the error adjusting value and generate a proportional adjusting value, so that the frequency divider adjusts the variable frequency factor based on the error adjusting value at every proportional adjusting value of a next reference interval;
    wherein by adjusting the variable frequency factor, the slave device receives the lock frequency signal and synchronizes a frequency with a master device to which the slave device connects.

2. The frequency synchronizing apparatus of claim 1, wherein the counter unit includes a Down Counter.

3. The frequency synchronizing apparatus of claim 1, wherein the currently detected deviation is positive, negative, or zero, and the error adjusting value is positive, negative, or zero.

4. The frequency synchronizing apparatus of claim 1, wherein in the value tuning process, the sum of all the detected deviations is divided by the threshold value to obtain a proportional pulse value, so that the adjusting unit then accordingly generates the proportional adjusting value according to a summation of the error adjusting value and the proportional pulse value.

5. The frequency synchronizing apparatus of claim 4, wherein the proportional pulse values at the different reference intervals are added to the error adjusting value until the sum of all the detected deviations becomes smaller than the threshold value.

6. The frequency synchronizing apparatus of claim 4, wherein the value tuning process further performs a compensation process in which the proportional pulse value is temporarily stored before being added to a subsequently detected deviation during the next reference interval, and then the register receives a summation of the subsequently detected deviation and the proportional pulse value before the summation of the proportional pulse value and the subsequently detected deviation is restored to the register.

7. The frequency synchronizing apparatus of claim 1, wherein the adjusting unit further comprises:
    a proportional adjusting value generating unit, used to receive the error adjusting value and generate the proportional adjusting value according to the error adjusting value; and
    a signal generator, used to generate a control signal at every proportional adjusting value of the next reference interval, wherein the control signal is used to control the frequency divider to adjust the variable frequency factor based on the error adjusting value.

8. The frequency synchronizing apparatus of claim 7, wherein the signal generator is a Down Counter.

9. A method of synchronizing USB frequency of a slave device with a start of frame (SOF) signal to mark a reference interval, comprising:
    dividing a high frequency signal by a variable frequency factor to obtain a lock frequency signal;
    detecting a pulse number of the lock frequency signal during a current reference interval, calculating a difference between a default pulse number and the pulse number of the lock frequency signal to obtain a currently detected deviation;
    recording the currently detected deviation, and performing an addition operation which adds the currently detected deviation and a previously detected deviation to obtain an error adjusting value;
    generating a proportional adjusting value based on the error adjusting value, and adjusting the variable frequency factor based on the error adjusting value at every proportional adjusting value during a next reference interval; and
    accumulating all the detected deviations, and performing a value tuning process when a sum of all the detected deviations exceeds a threshold value;
    wherein by adjusting the variable frequency factor, the slave device receives the lock frequency signal and synchronizes a frequency with a master device to which the slave device connects.

10. The method of claim 9, wherein the currently detected deviation is positive, negative, or zero, and the error adjusting value is positive, negative, or zero.

11. The method of claim 9, wherein in the value tuning process, the sum of all the detected deviations is divided by the threshold value to obtain a proportional pulse value, and the proportional adjusting value is generated according to a summation of the error adjusting value and the proportional pulse value.

12. The method of claim 11, wherein the proportional pulse values at different reference intervals are added to the error adjusting value until the sum of all the detected deviations becomes smaller than the threshold value.

13. The method of claim 11, wherein the value tuning process further performs a compensation process in which the proportional pulse value is temporarily stored before being added to a subsequently detected deviation during the next reference interval.

* * * * *